(12) United States Patent
Kikuchi et al.

(10) Patent No.: US 8,723,065 B2
(45) Date of Patent: May 13, 2014

(54) SWITCH (75) Inventors: Hidetake Kikuchi, Tokyo (JP); Takashi Kawamura, Tokyo (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 147 days.

(21) Appl. No.: 13/288,063

(22) Filed: Nov. 3, 2011

(65) Prior Publication Data

US 2012/0118720 A1 May 17, 2012

(30) Foreign Application Priority Data

Nov. 11, 2010 (JP) .................................. 2010-253223

(51) Int. Cl.
*H01H 1/10* (2006.01)

(52) U.S. Cl.
USPC .......................................................... 200/512

(58) Field of Classification Search
USPC ......... 200/511–513, 406, 520, 521, 329, 339, 200/341, 345, 293, 5 R
See application file for complete search history.

(56) References Cited

U.S. PATENT DOCUMENTS

| | | | |
|---|---|---|---|
| 5,245,147 A * | 9/1993 | Kobayashi | 200/520 |
| 7,022,928 B2 * | 4/2006 | Watanabe et al. | 200/406 |
| D590,782 S | 4/2009 | Asada | |
| 7,525,059 B2 * | 4/2009 | Masuda et al. | 200/406 |
| 8,410,381 B2 * | 4/2013 | Yanai et al. | 200/275 |
| 2009/0266689 A1 * | 10/2009 | Kikuchi et al. | 200/293 |
| 2011/0303520 A1 * | 12/2011 | Burnel et al. | 200/512 |
| 2012/0111712 A1 * | 5/2012 | Cour et al. | 200/511 |

FOREIGN PATENT DOCUMENTS

| | | |
|---|---|---|
| JP | 06-86323 | 12/1997 |
| JP | 2003-086056 | 3/2003 |
| JP | 2004-158349 | 6/2004 |
| JP | 2006-236805 | 7/2006 |
| JP | 2006236805 | 9/2006 |
| JP | 2008287905 | 11/2008 |
| WO | WO 2004/109732 | 12/2004 |

OTHER PUBLICATIONS

European Search Report. Mar. 21, 2012.
Japan Patent Office Office Action dated Sep. 17, 2013.

* cited by examiner

*Primary Examiner* — Edwin A. Leon
*Assistant Examiner* — Anthony R. Jimenez
(74) *Attorney, Agent, or Firm* — Whitham Curtis Christofferson & Cook, PC (57) ABSTRACT

A switch includes an insulative case with fixed electrodes and a movable electrode therein. The case includes a first surface configured to contact with a circuit board and a second surface configured to oppose to the circuit board via a gap. The movable electrode moves between a first position for placing the fixed electrodes in a conductive state and a second position for placing the fixed electrodes in a nonconductive state. Each of the fixed electrodes includes a contact terminal which contacts with the movable electrode and an external connecting terminal exposed on the second surface and soldered to a land of a wiring terminal on the circuit board. The external connecting terminal includes a first portion opposed to the land and a second portion connected to the first portion that has an area larger than an area of the first portion.

6 Claims, 13 Drawing Sheets

SWITCH

BACKGROUND

The present invention is related to the structure of a terminal to be soldered in mounting a switch used for various kinds of electronic devices on a circuit board. In particular, the present invention is related to the terminal structure of a push switch.

A push switch used for various kinds of small-sized electronic devices such as a mobile phone is disclosed in a patent document 1, for example.

Figure 13:
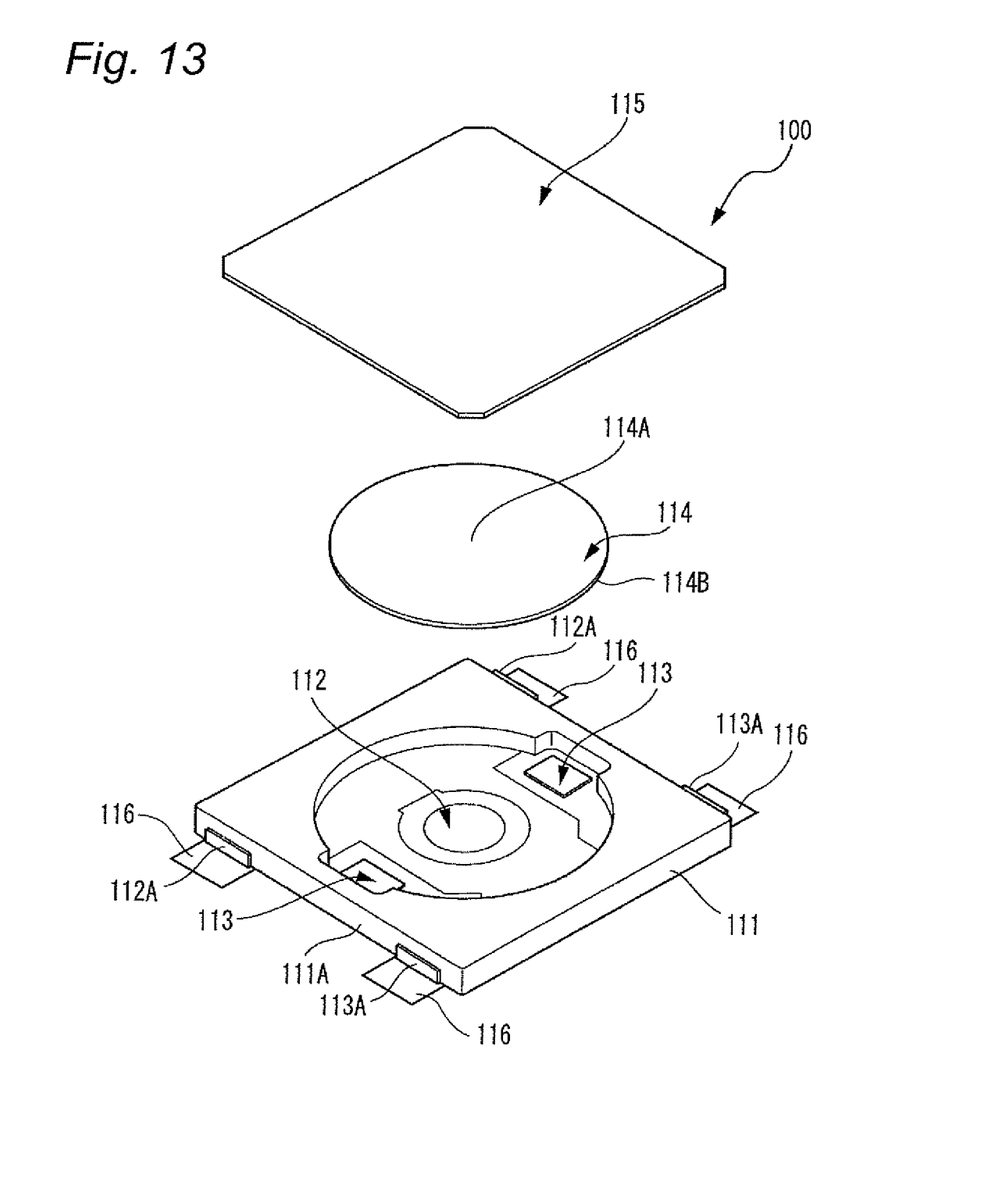
FIG. 13 is an exploded perspective view of a push switch of a related art.

An example of the push switch of the related art is shown in FIG. 13. This push switch 100 includes a switch case 111, a first fixed electrode 112, a pair of second fixed electrodes 113, a movable electrode 114 and a cover sheet 115.

The switch case 111 has a box-type shape which upper surface is opened, and is formed by insulative resin. The first fixed electrode 112 is fixed at the center portion of the inner bottom surface of the opening portion. The pair of second fixed electrodes 113 are respectively fixed at opposed positions of the switch case so as to sandwich the first fixed electrode 112 therebetween.

The movable electrode 114 includes a dome-shaped center portion 114A expanded upward and is accommodated within the switch case 111 so that the lower surface of the center portion 114A opposes to the first fixed electrode 112 with a space therebetween and an edge portion 114B of the movable electrode contacts with the second fixed electrodes 113.

The cover sheet 115 is formed by a flexible insulative film having a square-shape and is attached on the upper surface of the switch case 111 so as to cover the opening portion of the switch case 111.

When the cover sheet 115 is pushed down from the upper direction, the center portion 114A of the movable electrode 114 located beneath the cover sheet is pushed down via the cover sheet 115. When the pushed-down force exceeds a predetermined value, the center portion 114A is reversed moderately to expand downward, whereby the lower surface of the center portion 114A contacts with the first fixed electrode 112. Thus, the first fixed electrode 112 conducts with the second fixed electrodes 113 via the movable electrode 114 (switch on state). In contrast, when the pushed-down force is removed, the center portion 114A returns moderately to the original position to expand upward due to the restoring force of the movable electrode 114, whereby the conductive state between the first fixed electrode 112 and the second fixed electrodes 113 is cancelled (switch off state).

Figure 14:
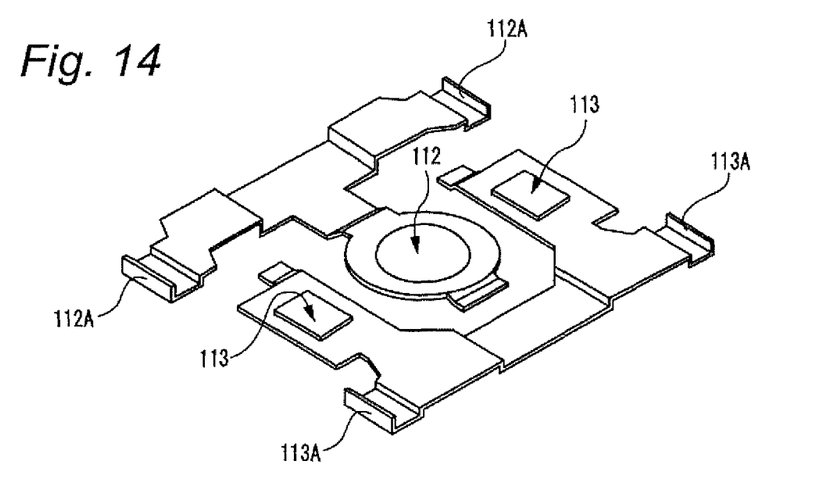
FIG. 14 is a perspective view of a first fixed electrode and a second fixed electrode in the push switch of the related art.

As shown in FIG. 14, the tip ends of extended portions from the first fixed electrode 112 and each of the second fixed electrodes 113 are bent upward to form terminal portions 112A and 113A, respectively. These terminal portions are exposed to the outer side surface 111A of the switch case 111 and used as external connection terminals.

[Patent Document 1] Japanese Patent No. 4457918

SUMMARY

Usually, in the case of mounting the push switch on the circuit board to thereby connect with a peripheral circuit, the terminal portions are disposed on lands formed on the circuit board, and the terminal portions and the lands are made conductive by means of solder. Also the push switch is fixed on the circuit board by the solder. In this case, in order to maintain the good conductive state between the terminal portions and the lands and to ensure a fixing intensity of a certain degree therebetween, the amount of solder is larger than the minimum value necessary for conducting between the terminal portions and the lands. If excessive solder remains between the terminal portion and the land, the terminal portion is pushed up and hence the push switch is placed in a state that it is raised (lifted up) from the circuit board. When the push switch is pushed down in this state, a stress is concentrically applied to the lifted-up portion and so the lifted-up portion may be broken.

Figure 15:
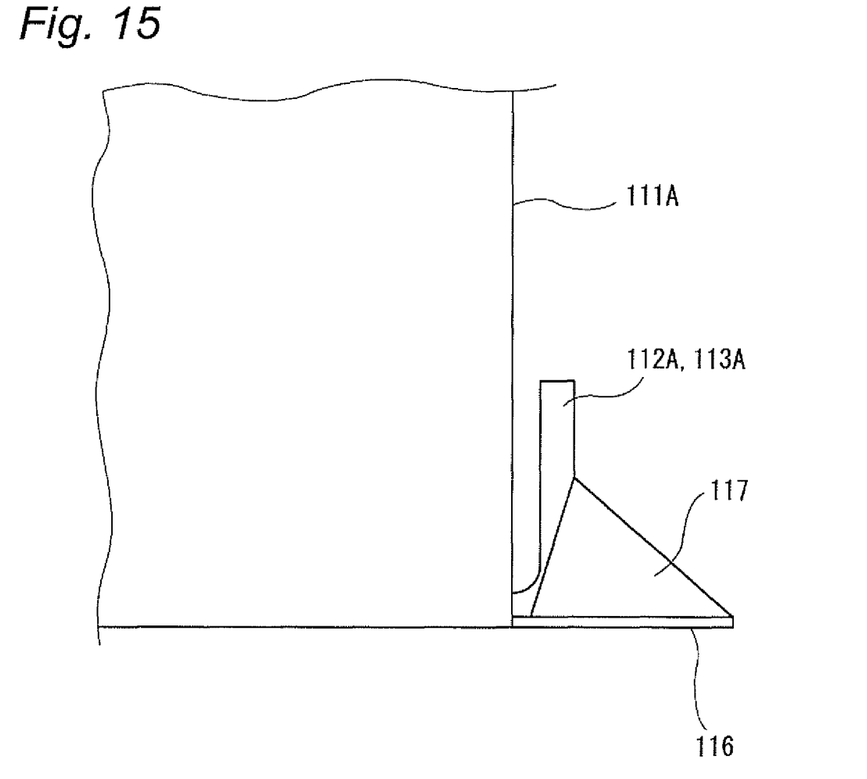
FIG. 15 is a partially enlarged view typically showing a state that the push switch of the related art is mounted on a circuit board.

In order to prevent such a phenomenon, as shown in FIGS. 13 and 15, the land 116 provided on the circuit board is extended to the outside of the push switch 100 so as to act as a save area for excessive solder 117. FIG. 15 shows a state that the land 116 extended to the outside saves the excessive solder 117 to thereby form a fillet.

The mounting area of the push switch 100 is defined as an area including the lands 116. Since each of the lands 116 is required to be extended to the outside from the outer edge of the push switch 100 due to the aforesaid reason, it is inevitable that the mounting area is larger than the area of the push switch 100 itself. This becomes a cause for interfering with the miniaturization of devices that have been required in recent years.

Further, in order to form the first fixed electrode 112, the second fixed electrodes 113 and the terminals 112A, 113A shown in FIG. 14, it is required to provide a process of bending the terminals 112A, 113A upward after punching a conductive member of a flat-plate shape into a predetermined frame shape. Thus, since a mold becomes complicated, the manufacturing cost of the push switch may be increased.

It is therefore one advantageous aspect of the present invention to provide a switch which can reduce a mounting area without increasing a manufacturing cost thereof.

According to one aspect of the invention, there is provided a switch to be mounted on a circuit board, the switch comprising:

an insulative case, including a first surface configured to contact the circuit board in a state where the switch is mounted on the circuit board and a second surface configured to oppose the circuit board via a gap in a state where the first surface contacts the circuit board;

a plurality of fixed electrodes accommodated in the case; and a movable electrode, accommodated in the case, and configured to move between a first position for placing the fixed electrodes in a conductive state and a second position for placing the fixed electrodes in a nonconductive state, wherein each of the plurality of fixed electrodes includes:
a contact terminal configured to contact the movable electrode; and
an external connecting terminal, exposed on the second surface, and configured to be soldered to a land of a wiring terminal provided on the circuit board in the state where the switch is mounted on the circuit board, and wherein the external connecting terminal includes:
a first portion configured to oppose to the land; and
a second portion connected to the first portion and having an area larger than an area of the first portion.

In at least one of the plurality of fixed electrodes, the first portion of the external connecting terminal may have a third portion protruding from the second surface of the case.

A tip end portion of the external connecting terminal may be exposed on a side surface of the case and may located inside of an outermost edge of the case.

A moving direction of the movable electrode may coincide with a normal direction of the first surface of the case.

DETAILED DESCRIPTION OF EXEMPLIFIED EMBODIMENTS

The embodiments according to this invention will be explained in detail with reference to attached drawings.

As shown in FIGS. 1 to 6, a push switch 1 according to the first embodiment of the invention includes a switch case 2, a first fixed electrode 3, a second fixed electrode 4, a movable electrode 5 and a cover sheet 6.

The switch case 2 is formed by a box-shaped insulative resin which concave portion 2a has an opened upper surface 2b. The first fixed electrode 3 includes contact terminals 3a each of which is exposed within the concave portion 2a and capable of contacting the center portion 5a of the movable electrode 5, and an external connecting terminal 3b which is exposed at least on the side surface of the switch case 2 opposed to the mounting surface of the circuit board and is coupled to the lands of wiring terminals formed on the mounting surface. The second fixed electrode 4 includes a pair of contact terminals 4a each of which is exposed within the concave portion 2a and contacts an edge portion 5b of the movable electrode 5, and an external connecting terminal 4b which is exposed at least on the side surface of the switch case 2 opposed to the mounting surface of the circuit board and is coupled to the lands of the wiring terminals formed on the mounting surface. The contact terminals 3a are fixed at the center of the inner bottom surface of the concave portion 2a. The pair of contact terminals 4a are fixed at opposite positions sandwiching the contact terminals 3a therebetween.

The movable electrode 5 is a conductive member capable of being deformed elastically. The movable electrode 5 includes a dome-shaped center portion 5a expanded upward and is accommodated within the concave portion 2a in a manner that the lower surface of the center portion 5a opposes the contact terminals 3a with a space therebetween and the edge portion 5b contacts the pair of contact terminals 4a. The number of contact terminal 4a is not required to be plural but may be at least one.

The cover sheet 6 is formed by a flexible insulative film of an almost square-shape and is attached on the upper surface 2b of the switch case 2 so as to cover the concave portion 2a. Thus, dust and moisture etc. can be prevented from entering into the concave portion 2a from the outside to thereby prevent the corrosion of the first fixed electrode 3, the second fixed electrode 4 and the movable electrode 5. The material of the insulative film may be resin such as polyimide, for example.

When the cover sheet 6 is pushed down from the upper direction, the center portion 5a of the movable electrode 5 located beneath the cover sheet is pushed down via the cover sheet 6. When the pushed-down force exceeds a predetermined value, the center portion 5a is reversed moderately so as to expand downward, whereby the lower surface of the center portion 5a contacts with the contact terminal 3a. Thus, the first fixed electrode 3 conducts with the second fixed electrode 4 via the movable electrode 5 (switch on state). In contrast, when the pushed-down force is removed, the center portion 5a returns moderately to the original position so as to expand upward due to the restoring force (elasticity) of the movable electrode 5, whereby the conductive state between the first fixed electrode 3 and the second fixed electrode 4 is cancelled (switch off state).

The side surface of the switch case 2 opposing the mounting surface of the circuit board includes a bottom surface 2c (first surface) and a terminal exposed surface 2f (second surface) where the external connecting terminals 3b, 4b are exposed. As is clear from FIGS. 2A to 2D, the external connecting terminals 3b, 4b and the terminal exposed surface 2f are formed on almost the same surface. Since a step is provided between the bottom surface 2c and the terminal exposed surface 2f, when the switch case 2 is disposed on the circuit board so that the bottom surface 2c contacts with the circuit board, the terminal exposed surface 2f, that is, the external connecting terminals 3b, 4b oppose to the circuit board via a gap therebetween.

Figure 7:
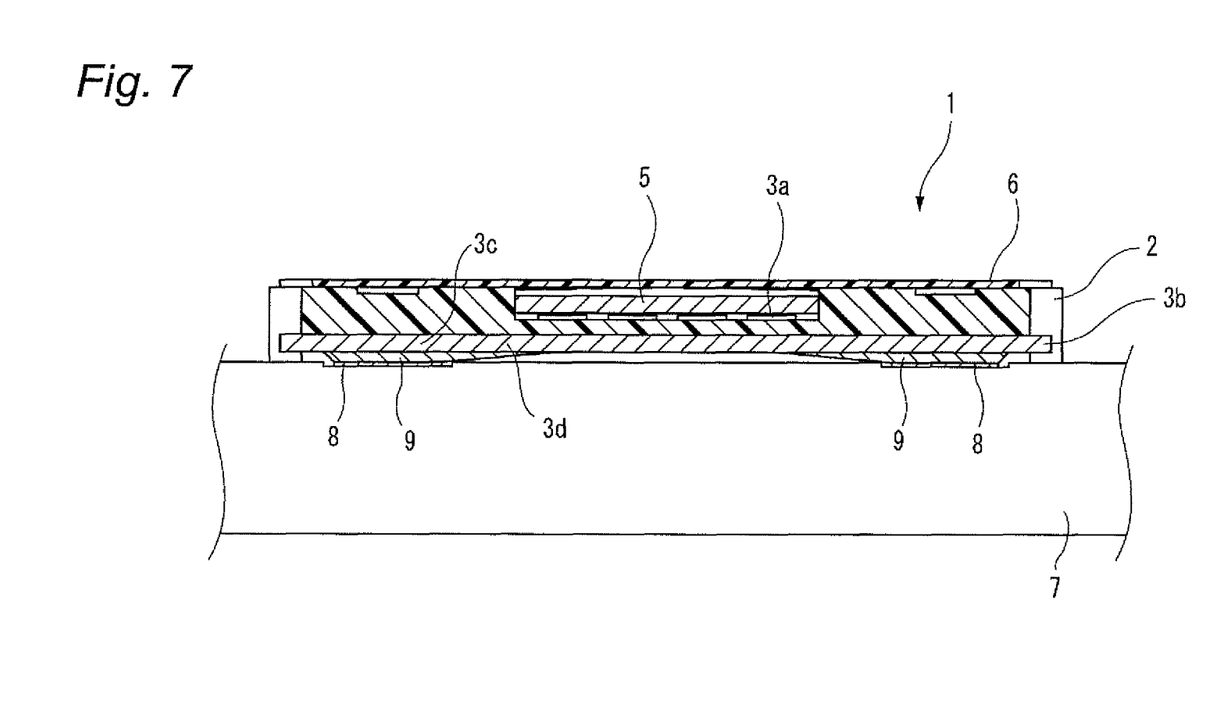
FIG. 7 is a sectional view along the line V-V in FIG. 2A showing a state that the push switch according to the first embodiment is mounted on a circuit board.

As shown in FIG. 7, the push switch 1 according to this embodiment is mounted on the circuit board 7. The lands 8 of the wiring terminal are formed on the mounting surface of the circuit board 7, and the external connecting terminals 3b, 4b and the lands are electrically connected by means of soldering. In this figure, although only the external connecting terminal 3b is shown, the external connecting terminal 4b is electrically connected in a similar manner.

Figure 1:
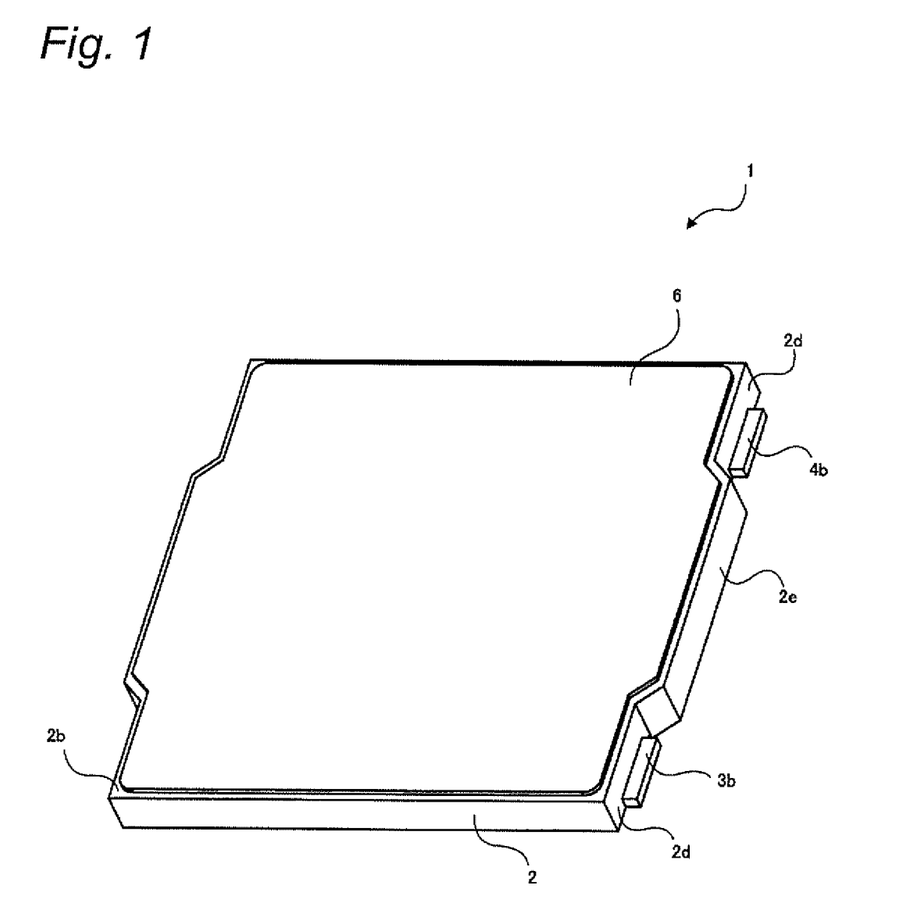
FIG. 1 is a perspective view of a push switch according to a first embodiment of the invention.
Figure 2A:
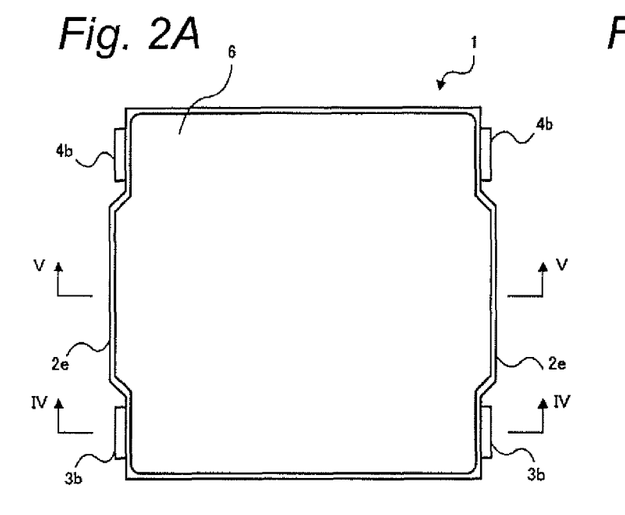
FIG. 2A is a top view showing of the push switch according to the first embodiment.
Figure 2B:
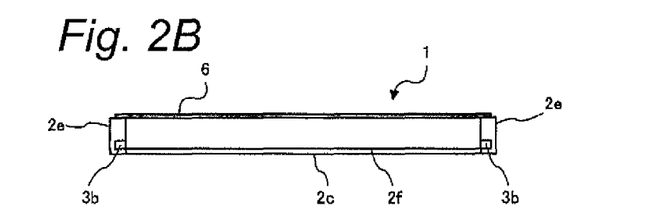
FIG. 2B is a front view of the push switch according to the first embodiment.
Figure 2C:
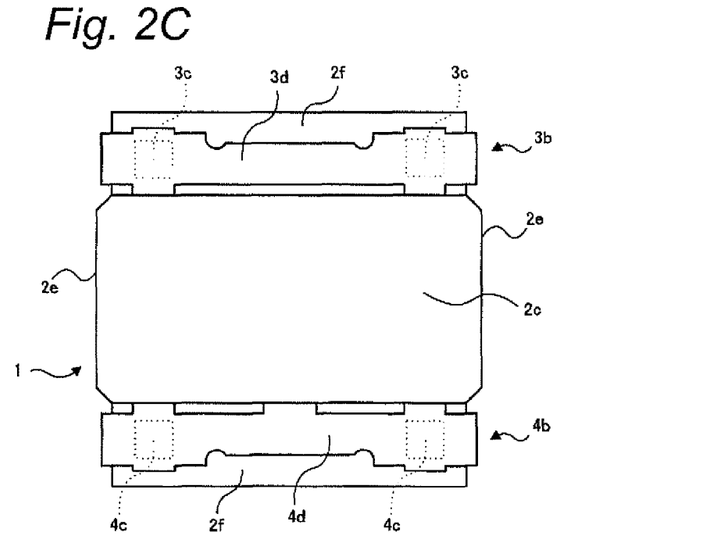
FIG. 2C is a bottom view of the push switch according to the first embodiment.
Figure 2D:
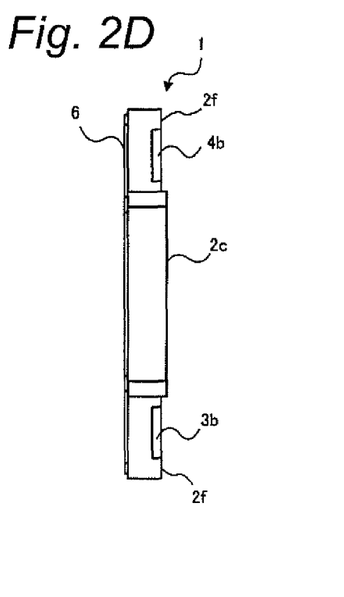
FIG. 2D is a right side view of the push switch according to the first embodiment.
Figure 3:
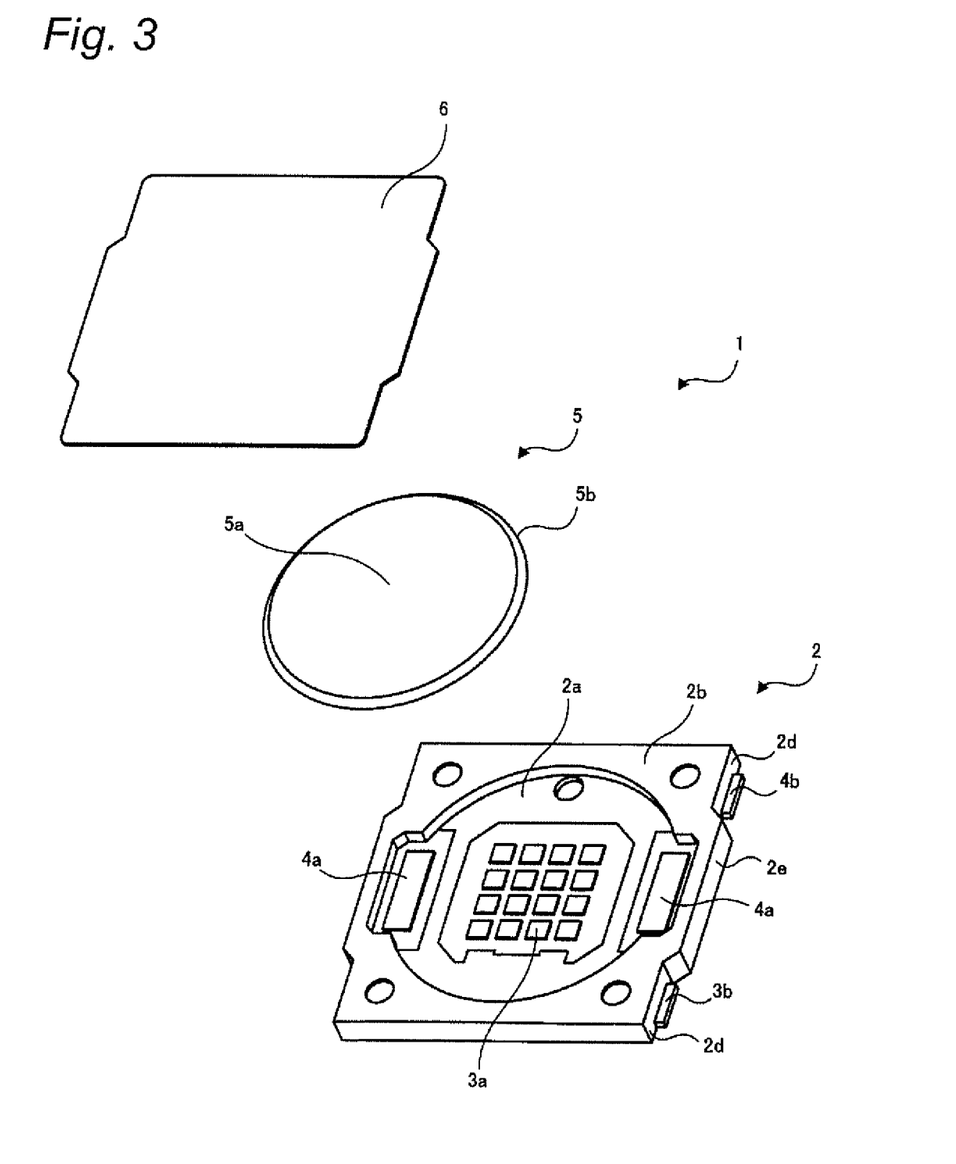
FIG. 3 is an exploded perspective view of the push switch according to the first embodiment.
Figure 4:
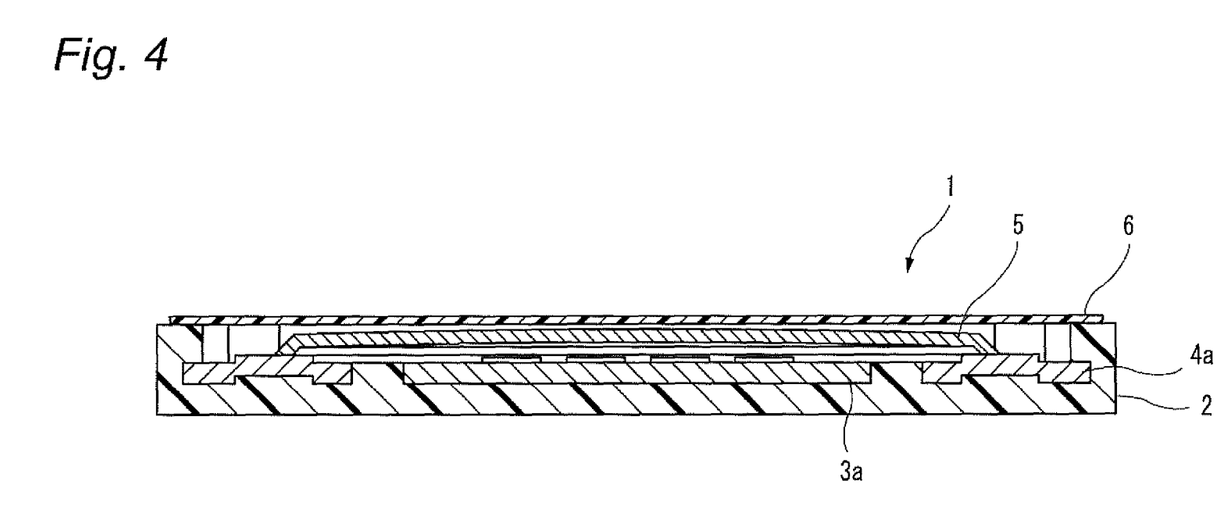
FIG. 4 is a sectional view of the push switch along a line IV-IV in FIG. 2A.
Figure 5:
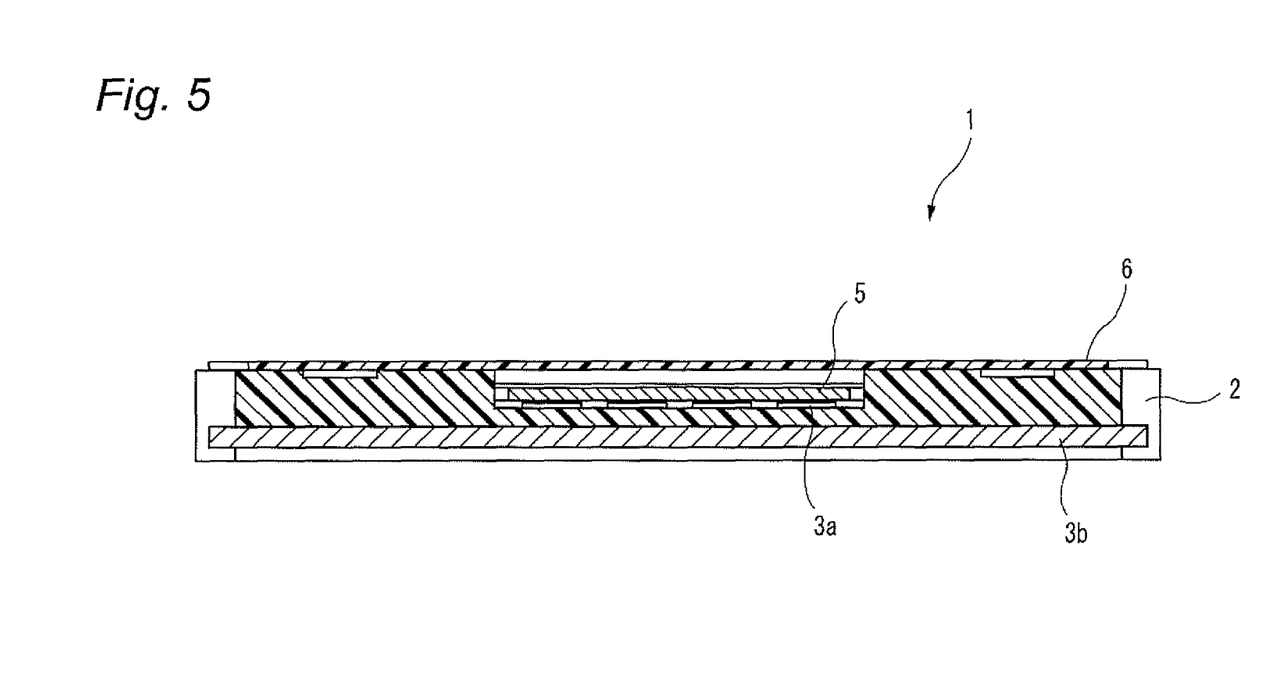
FIG. 5 is a sectional view of the push switch along a line V-V in FIG. 2A.
Figure 6:
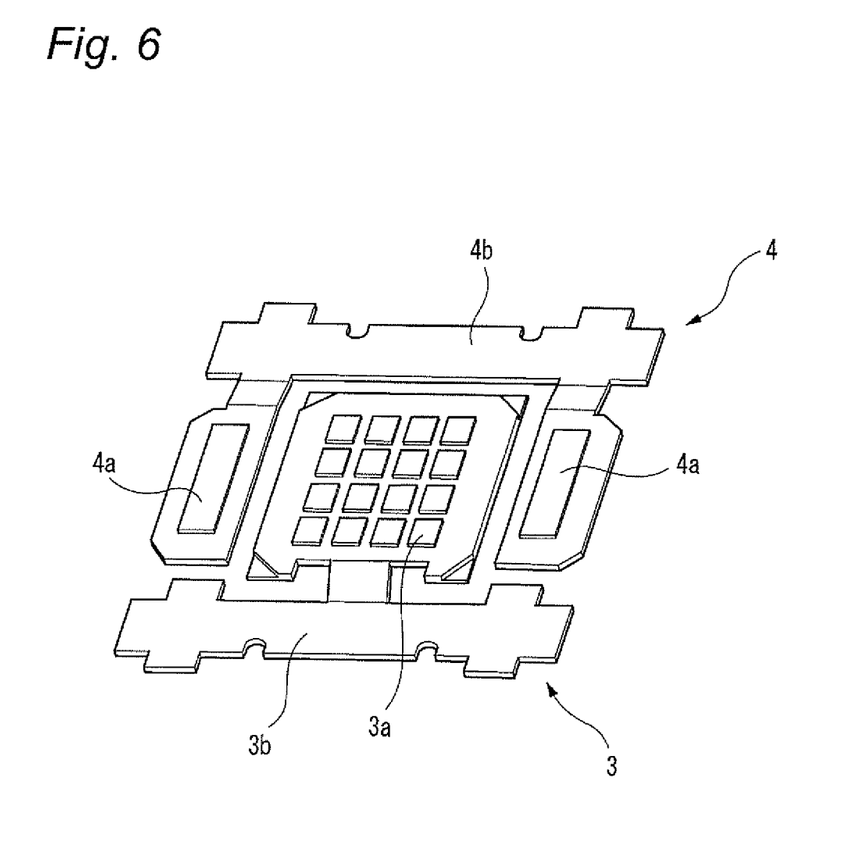
FIG. 6 is a perspective view of a first fixed electrode and a second fixed electrode in the push switch according to the first embodiment.

As shown in FIG. 2C, the lower surfaces of the external connecting terminals 3b, 4b include land opposing portions 3c, 4c (first portions) and solder saving portions 3d, 4d (second portions), respectively. The land opposing portions 3c, 4c and the solder saving portions 3d, 4d continue in a physical and property aspect and there is no clerical boundary therebetween. In this case, each of the land opposing portions 3c, 4c is defined as a portion opposing to the land 8 of the circuit board 7, that is, a portion having the same area as the land 8. Further, of the portions of the external connecting terminals 3b, 4b exposed on the terminal exposed surface 2f of the switch case 2, portions other than the land opposing portions 3c, 4c are defined as the solder saving portions 3d, 4d, respectively. The solder saving portions 3d, 4d include portions having areas larger than the land opposing portions 3c, 4c, respectively.

In order to maintain a good conductive state between the external connecting terminals 3b, 4b of the push switch 1 and the lands 8 of the wiring terminals and to secure the fixing intensity of a certain level, the amount of solder 9 is larger than the minimum value necessary for conducting between the external connecting terminals 3b, 4b and the lands 8. Since the solder saving portions 3d, 4d having areas larger than the land opposing portions 3c, 4c are secured on the lower surfaces of the external connecting terminals 3b, 4b of this embodiment, respectively, excessive portions of the solder 9 flow into these saving portions and then are solidified.

In a state shown in FIG. 7, although the excessive solder 9 is also saved at the right side of the land 8 (the tip end sides of the external connecting terminals 3b, 4b, the outside of the switch case 2), more solder flows toward the left side of the land 8 (inner side of the switch case 2) where the solder saving portions 3d, 4d having larger areas exist.

Thus, according to the configuration of this embodiment, since it is not necessary to extend the land 8 to the outside of the switch case 2 so as to act as the saving area for the excessive solder, the mounting area of the push switch 1 does not exceed the area of the push switch 1 itself. Thus, the configuration of this embodiment can contribute to the reduction of the mounting area required according to the miniaturization of devices.

Further, according to the demand for the reduction of the height, the gap between the land 8 and each of the external connecting terminals 3b, 4b is required to be as small as possible. According to the configuration of this embodiment, since the excessive solder 9 can be surely saved at the solder saving portions 3d, 4d having the large areas, not only the lifting of the switch case 2 from the circuit board 7 due to the excessive solder but also the breakage of the push switch 1 upon the pushing-down operation according to the lifting can be prevented from occurring, while using the solder 9 which amount is sufficient for securing the fixing intensity of the push switch 1.

The switch case 2 is formed by the insert molding together the first fixed electrode 3 and the second fixed electrode 4 in a manner that the extended portions for respectively connecting between the contact terminals 3a, 4a and the external connecting terminals 3b, 4b are buried within the switch case 2. In this embodiment, the tip end portions of the external connecting terminals 3b, 4b are exposed from the side surface 2d of the switch case 2. These exposed portions correspond to portions remaining after cutting the coupling portions between products used for the hoop feeding into the mold at the time of the insert molding. As is clear from FIGS. 1 to 5, the tip end portions are located inside than the outermost edge 2e of the switch case 2. Thus, since the excessive portions of the solder 9 never move outside than the switch case 2, such a state can be prevented from occurring that the mounting area of the push switch 1 exceeds the area of the push switch 1 itself.

Further, unlike the first fixed electrode 112 and the second fixed electrodes 113 of the push switch 100 of the related art, since a mold for performing a complicated bending process is not required at the time of manufacturing each of the first fixed electrode 3 and the second fixed electrode 4, the increase of the manufacturing cost can be avoided.

Figure 8:
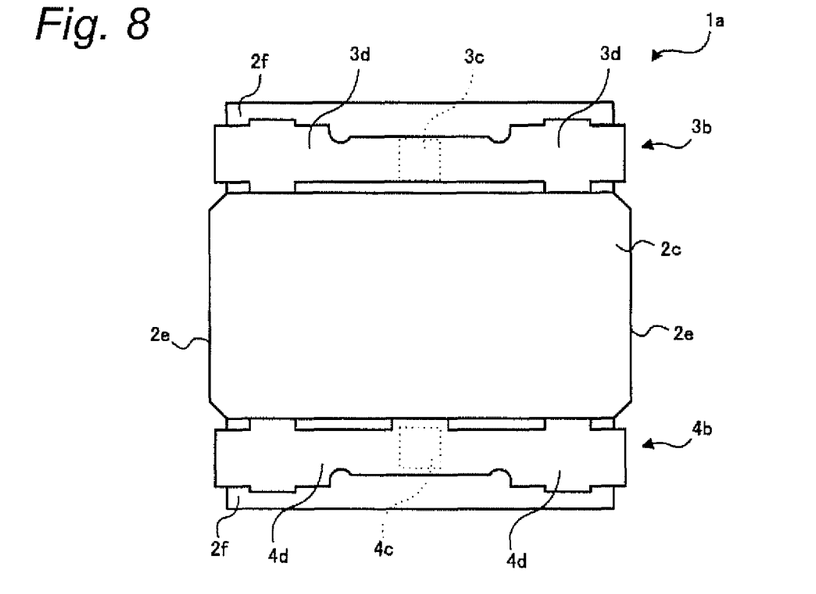
FIG. 8 is a bottom view showing a first modified example of the push switch according to the first embodiment.

The positions of the land opposing portions 3c, 4c can be suitably changed within the exposed area of the external connecting terminals 3b, 4b exposed on the terminal exposed surface 2f of the switch case 2 in accordance with the arrangement of the lands 8 on the circuit board 7 to be mounted. For example, in a push switch 1a according to a first modified embodiment shown in FIG. 8, the land opposing portions 3c, 4c are formed at the centers along the extended directions of the extended portions of the external connecting terminals 3b, 4b and the solder saving portions 3d, 4d are formed at both the opposite sides thereof, respectively, Excessive portions of the solder 9 used for connecting between the lands 8 and the land opposing portions 3c, 4c flow into these saving portions 3d, 4d at the opposite sides and then are solidified.

Figure 9:
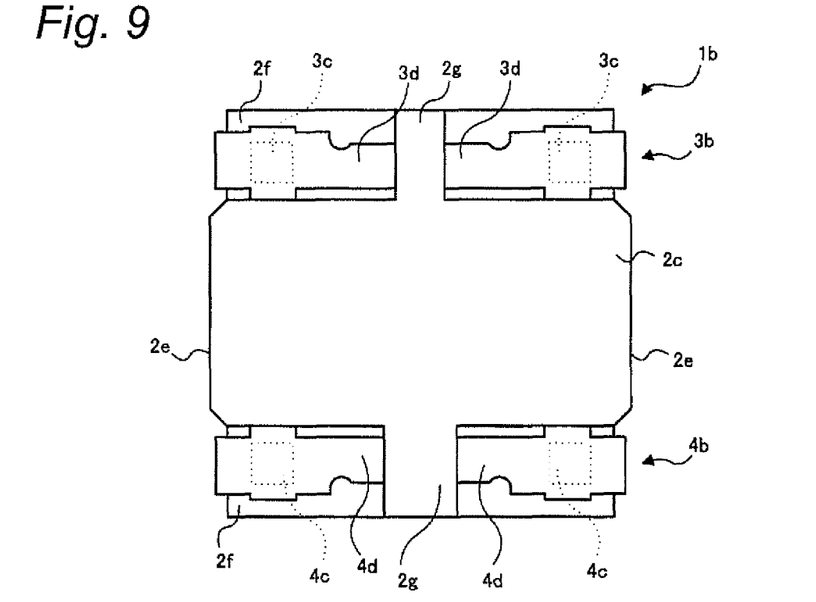
FIG. 9 is a bottom view showing a second modified example of the push switch according to the first embodiment.
Figure 10A:
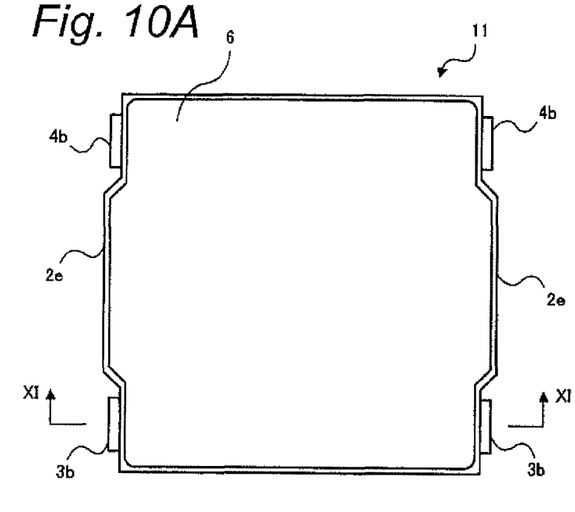
FIG. 10A is a top view of a push switch according to a second embodiment of the invention.
Figure 10B:
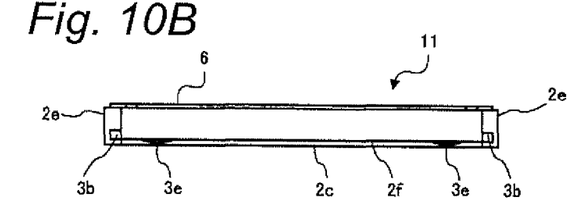
FIG. 10B is a front view of the push switch according to the second embodiment.
Figure 10C:
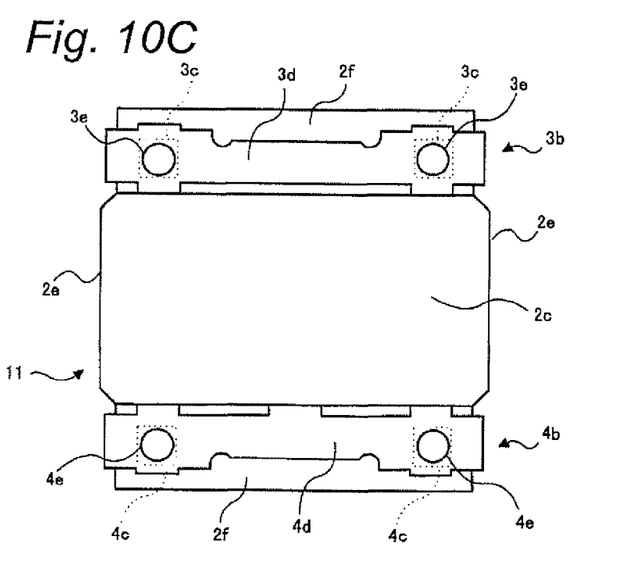
FIG. 10C is a bottom view of the push switch according to the second embodiment.
Figure 10D:
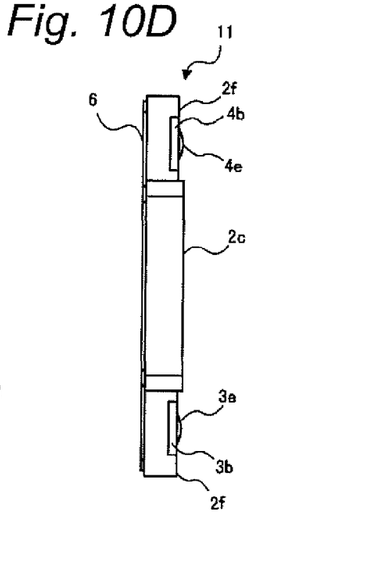
FIG. 10D is a right side view of the push switch according to the second embodiment.

The shape of the terminal exposed surface 2f of the switch case 2 can be suitably changed according to the specification of the product. For example, a push switch 1b according to a second modified embodiment shown in FIG. 9 is configured that the centers along the extended directions of the extended portions of the external connecting terminals 3b, 4b are covered by cover portions 2g extended from the bottom surface 2c. In this embodiment, although each of the external connecting terminals 3b, 4b is continually connected at the portion covered by the cover portion 2g, each of the external connecting terminals may be cut at the portion covered by the cover portion 2g according to the specification of the circuit.

The arrangement and the shape of each of the solder saving portions 3d, 4d is not limited to the examples shown in FIGS. 1 to 7 so long as a sufficient area is secured as the saving area for the excessive solder in view of a used amount of the solder 9 which differs depending on the specification, as explained above with reference to FIGS. 8 and 9.

Next, a push switch 11 according to a second embodiment of the invention will be explained with reference to FIGS. 10 to 12. In this embodiment, elements having substantially same structures or functions as those of the first embodiment are referred to by the common symbols, with repetitive explanations thereof being omitted.

This embodiment differs from the first embodiment in a point that parts of the land opposing portions 3c, 4c are expanded downward, that is, to the land side to form expanded portions 3e, 4e (third portions), respectively. These land opposing portions 3c, 4c can be formed by simultaneously performing the squeezing processing together with the portions 3a, 4a, for example, in the forming process of the first fixed electrode 3 and the second fixed electrode 4.

Figure 12:
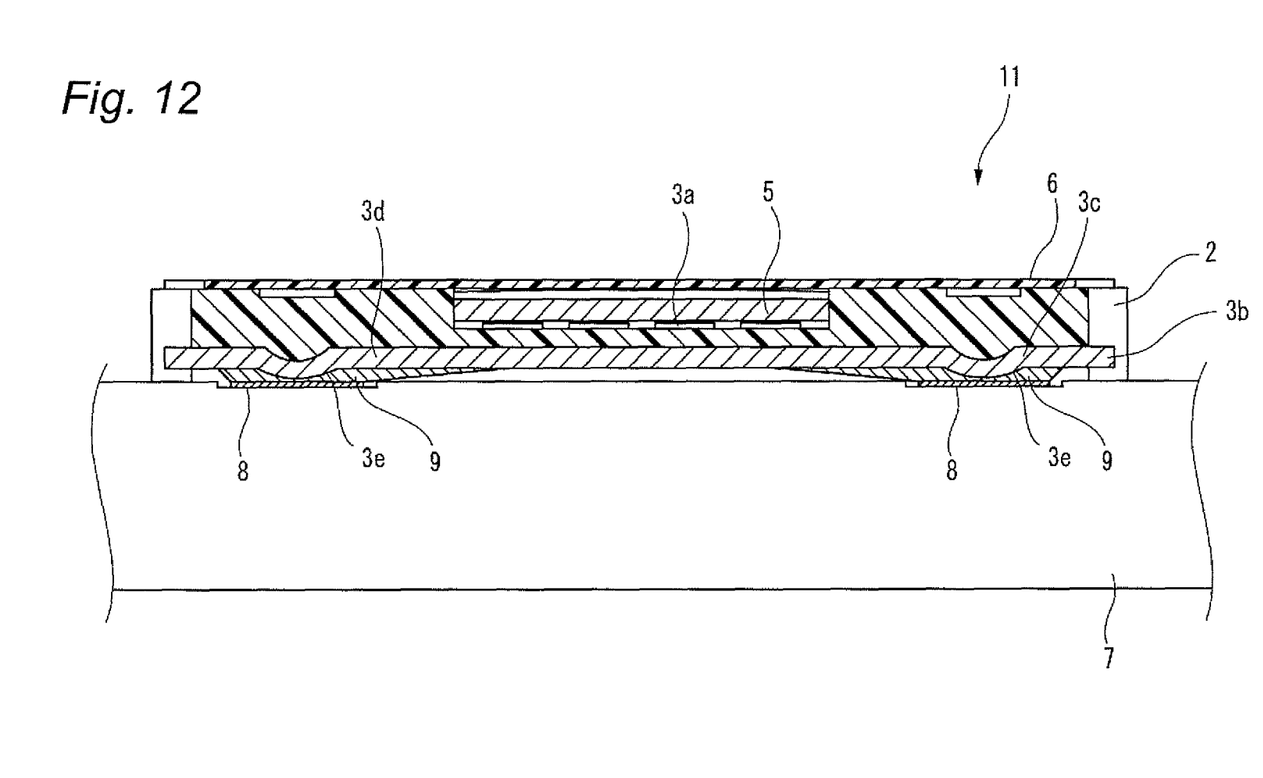
FIG. 12 is a sectional view along a line XI-XI in FIG. 10A showing a state that the push switch according to the second embodiment is mounted on the circuit board.

As shown in FIG. 12, since the expanded portions 3e, 4e protrude from the terminal exposed surface 2f, these expanded portions assist the flowing of the solder into the solder saving portions 3d, 4d of the solder 9, so that the soldering process can be performed more efficiently and surely.

Figure 11:
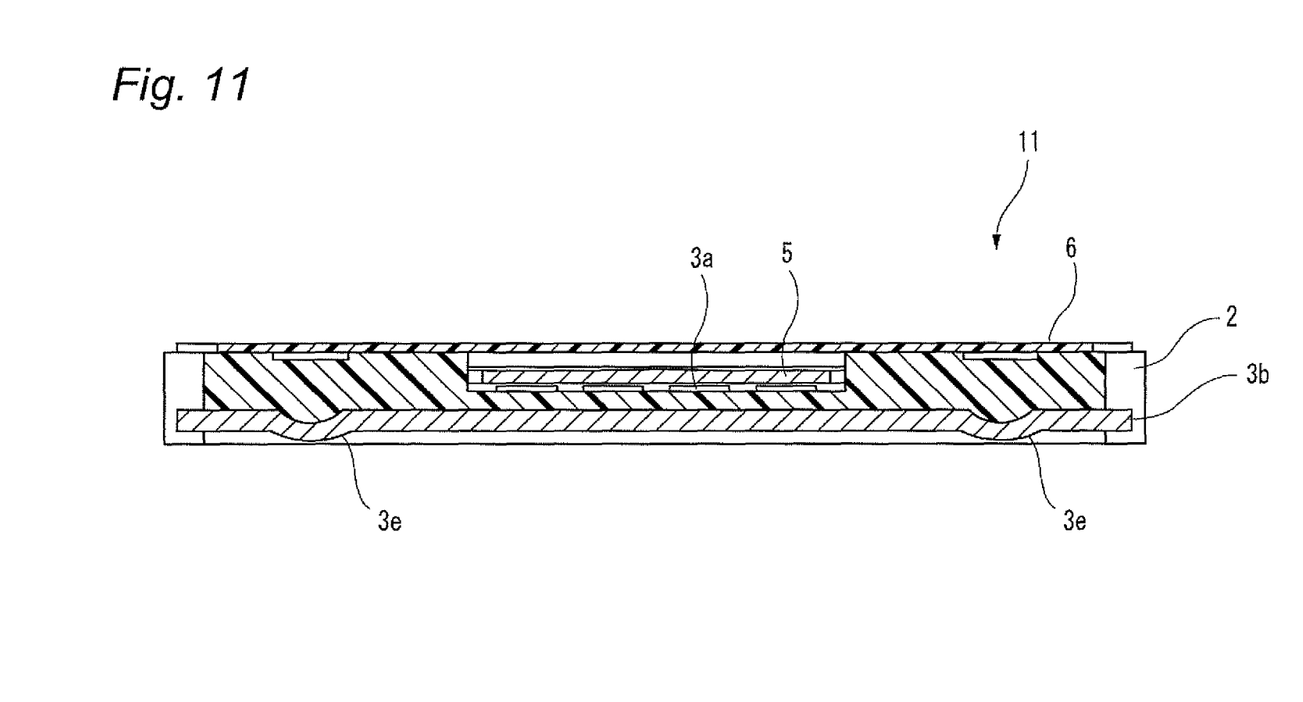
FIG. 11 is a sectional view of the push switch along a line XI-XI in FIG. 10A.

The positions of the land opposing portions 3c, 4c, that is, the expanded portions 3e, 4e and the positions of the solder saving portions 3d, 4d are not limited to the examples shown in FIGS. 10 to 12. So long as a sufficient area is secured as the saving area for the excessive solder in view of the positions of the lands 8 and a used amount of the solder 9 which differ depending on the specification, the positions of the land opposing portions 3c, 4c, that is, the expanded portions 3e, 4e and the positions of the solder saving portions 3d, 4d may be changed suitably as shown exemplarily in FIGS. 8 and 9.

In this embodiment, although each of the expanded portions 3e, 4e is formed in a dome shape, the shape and size thereof can be selected suitably so long as each of the expanded portions protrudes from the terminal exposed surface 2f. Further, the land opposing portions 3c, 4c may be configured that some of all the land opposing portions are provided with the expanded portions 3e, 4e and the remains thereof are not provided with the expanded portions.

The aforesaid embodiments are examples for facilitating the understanding of the invention and the invention is not limited thereto. Of course, the invention may be changed within a range not departing from the gist of the invention and the invention includes the equivalent thereof.

In order to maintain a good conductive state between the external connecting terminal of the switch and the land of the wiring terminal and to secure the fixing intensity of a certain level, usually, the amount of solder used is larger than the minimum value necessary for conducting between the external connecting terminal and the land. According to the invention, since the second portion having an area larger than the first portion opposing to the wiring terminal is secured at the external connecting terminal exposed on the surface opposing to the circuit board, an excessive portion of the solder flows into the second portion and then is solidified. Thus, since it is not necessary to extend the wiring terminal to the outside of the case in order to act as the saving portion for the excessive solder, the mounting area of the switch does not exceed the area of the switch itself. Thus, this configuration can contribute to the reduction of the mounting area required and thereby enable miniaturization of devices.

Further, according to the demand for the reduction of the height, the gap between the external connecting terminal and the wiring terminal is required to be as small as possible. According to the aforesaid configuration, since the excessive solder can be surely saved at the second portion having a large area, the lifting of the case from the circuit board due to the excessive solder can be prevented from occurring while using the solder which amount is sufficient for securing the fixing intensity of the switch.

According to the invention, the solder is smoothly lead to the second portion via the third portion. Thus, soldering process can be performed more efficiently and surely.

According to the invention, since the excessive portion of the solder does not move outside of the case, such a state can be prevented from occurring that the mounting area of the switch exceeds the area of the switch itself.

In the case of a so-called push switch, when the case is lifted up from the circuit board due to the excessive solder, the case and the coupling portion thereof are likely broken due to a pushing-down force. According to the invention, since the lifting-up can be prevented as explained above, such the state can be prevented from occurring.

In the aforesaid embodiments, although the explanation is made as to the examples where the invention is applied the push switch, the invention may be applied to a slide switch so long as the arrangement and the structure of terminals on the bottom surface side of a switch case thereof is similar to those of the push switch.

What is claimed is:

1. A switch to be mounted on a circuit board, the switch comprising:
    an insulative case, including a first surface configured to face the circuit board when the switch is mounted on the circuit board and a second surface opposite to the first surface;
    a plurality of fixed electrodes accommodated in the insulative case; and
    a movable electrode, accommodated in the insulative case, and configured to move between a first position for placing the fixed electrodes in a first state and a second position for placing the fixed electrodes in a second state,
    wherein the first surface of the case includes a center part and side parts, the side parts are located closer to the second surface than the center part and extend on both sides of the center part so as to communicate opposite end portions of the insulative case,
    wherein each of the plurality of fixed electrodes includes:
        a contact terminal configured to contact the movable electrode; and
        an external connecting terminal extending from one of the opposite end portions of the insulative case to the other of the opposite ends portions of the insulative case, and including an exposed part exposed on each of the side parts of the first surface of the insulative case, said exposed part communicates opposite ends of the external connecting terminal with each other.

2. The switch as set forth in claim 1, wherein, in at least one of the plurality of fixed electrodes, the exposed portion of the external connecting terminal has a projected portion protruding from the second surface of the case.

3. The switch as set forth in claim 1,
    wherein a tip end portion of the external connecting terminal is exposed on a side surface of the case and is positioned inside of an outermost edge of the case.

4. The switch as set forth in claim 1,
    wherein a moving direction of the movable electrode coincides with a normal direction of the first surface of the case.

5. The switch as set forth in claim 1, wherein the first state is a conductive state, and the second state is a non-conductive state.

6. The switch as set forth in claim 1, wherein the switch is a push switch.

* * * * *